(12) United States Patent
Ryan (10) Patent No.: US 11,693,038 B2
(45) Date of Patent: Jul. 4, 2023

(54) PORTABLE, INTEGRATED ANTENNA TEST BED WITH BUILT-IN TURNTABLE

(71) Applicant: HUAWEI TECHNOLOGIES CO., LTD., Guangdong (CN)

(72) Inventor: Colan Ryan, Plano, TX (US)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 17/353,363

(22) Filed: Jun. 21, 2021

(65) Prior Publication Data

US 2021/0311102 A1  Oct. 7, 2021

Related U.S. Application Data

(63) Continuation of application No. PCT/CN2019/093226, filed on Jun. 27, 2019.

(60) Provisional application No. 62/783,676, filed on Dec. 21, 2018.

(51) Int. Cl.
| | |
|---|---|
| *G01R 29/10* | (2006.01) |
| *G01R 29/08* | (2006.01) |
| *H04B 17/10* | (2015.01) |
| *H04B 17/309* | (2015.01) |

(52) U.S. Cl.
CPC ......... *G01R 29/0878* (2013.01); *G01R 29/10* (2013.01); *H04B 17/102* (2015.01); *H04B 17/309* (2015.01)

(58) Field of Classification Search
CPC .. G01R 29/0878; G01R 29/10; H04B 17/102; H04B 17/309

USPC ................................................. 455/67.11
See application file for complete search history.

(56) References Cited

U.S. PATENT DOCUMENTS

| | | | | |
|---|---|---|---|---|
| 5,485,158 | A * | 1/1996 | Mailloux | G01R 29/10 342/165 |
| 5,760,735 | A * | 6/1998 | Shamansky | G01S 7/4052 342/165 |
| 9,488,572 | B2 * | 11/2016 | Sertel | G01N 21/3581 |
| 10,473,587 | B2 * | 11/2019 | Sertel | H01Q 19/132 |
| 11,154,231 | B2 * | 10/2021 | Coleman | A61B 5/318 |
| 2004/0041978 | A1 * | 3/2004 | Neal | G01M 11/0257 351/204 |
| 2005/0206550 | A1 * | 9/2005 | Moller | G01R 29/0821 342/173 |
| 2006/0152232 | A1 * | 7/2006 | Shvets | G01R 31/2822 324/750.02 |
| 2006/0290369 | A1 * | 12/2006 | Yamashita | G01R 31/2887 324/756.07 |
| 2008/0303733 | A1 * | 12/2008 | Chiu | H01Q 21/28 343/770 |
| 2009/0096699 | A1 * | 4/2009 | Chiu | H01Q 9/16 343/797 |
| 2012/0092655 | A1 * | 4/2012 | Dozor | G02B 21/33 359/507 |

(Continued)

*Primary Examiner* — Hai V Nguyen
(74) *Attorney, Agent, or Firm* — Fish & Richardson P.C.

(57) ABSTRACT

The disclosure relates to technology for testing parameters of an antenna under test. The technology includes an antenna test bed, reference antenna and turntable for supporting the device and antenna under test. The turntable may be used to test the response of the antenna under test at different azimuth angles. Additionally, the reference antenna and turntable are integrated into a single test bed platform to ensure consistency and repeatability of test results.

21 Claims, 6 Drawing Sheets

(56) References Cited

U.S. PATENT DOCUMENTS

| | | | |
|---|---|---|---|
| 2013/0178203 A1* | 7/2013 | Venkataraman | H04W 4/16 |
| | | | 455/423 |
| 2014/0184253 A1* | 7/2014 | Nelsen | G01R 31/002 |
| | | | 324/750.02 |
| 2014/0347073 A1* | 11/2014 | Brown | G01R 31/311 |
| | | | 324/637 |
| 2015/0102225 A1* | 4/2015 | Sertel | G01N 21/3581 |
| | | | 250/341.5 |
| 2015/0168486 A1* | 6/2015 | Isaac | G01R 31/2822 |
| | | | 324/756.02 |
| 2017/0082682 A1* | 3/2017 | Lee | G01R 31/31816 |
| 2017/0131336 A1* | 5/2017 | Nelsen | G01R 31/2893 |
| 2017/0160324 A1* | 6/2017 | Hensarling | G01V 3/28 |
| 2018/0027434 A1* | 1/2018 | Foegelle | H04B 7/0617 |
| | | | 455/67.13 |
| 2018/0102860 A1* | 4/2018 | Emmanuel | H04W 36/0094 |
| 2019/0017931 A1* | 1/2019 | Sertel | G01N 21/3581 |
| 2019/0069788 A1* | 3/2019 | Coleman | A61B 5/0015 |
| 2019/0162774 A1* | 5/2019 | Huang | G01R 31/002 |
| 2019/0310315 A1* | 10/2019 | Sertel | G01R 1/06772 |
| 2019/0353698 A1* | 11/2019 | DaSilva | H04B 17/17 |
| 2019/0356397 A1* | 11/2019 | DaSilva | H04B 17/17 |
| 2020/0018617 A1* | 1/2020 | Cardalda-Garcia | G01C 21/28 |
| 2020/0037182 A1* | 1/2020 | Connolly | H04L 43/50 |
| 2020/0043875 A1* | 2/2020 | Zaman | H01L 23/66 |
| 2020/0084638 A1* | 3/2020 | Kronewitter, III | H04L 43/0876 |
| 2020/0091608 A1* | 3/2020 | Alpman | H01Q 1/2283 |
| 2022/0026479 A1* | 1/2022 | Park | G01R 29/105 |

\* cited by examiner

PORTABLE, INTEGRATED ANTENNA TEST BED WITH BUILT-IN TURNTABLE

CROSS REFERENCE TO RELATED APPLICATION

This application is a continuation of International Application No. PCT/CN2019/093226, filed on Jun. 27, 2019, which claims priority to U.S. provisional patent application Ser. No. 62/783,676, filed on Dec. 21, 2018 and entitled "A Portable, Integrated Antenna Test Bed With Built-In Turntable", both of which are incorporated herein by reference as if reproduced in their entirety.

FIELD

This disclosure generally relates to an apparatus for testing the performance of an antenna within a device under test.

BACKGROUND

Antennas are ubiquitous within wireless transmission devices such as cellular telephones for converting electrical signals from the devices into radio waves, and vice-versa. It is important to test performance parameters of an antenna, including for example gain, beam width, beam steering range, etc. Known systems for testing an antenna within a device under test include a reference antenna with known properties spaced a predefined distance from the device under test. Test systems may be near field or far field. In one example, a near field testing system is one where the reference antenna and device under test are separated by one wavelength of the emitted frequency or less. In one example, a far field testing system is one where the reference antenna and device under test are separated by two wavelengths of the emitted frequency or more, and represents the normal working mode of the two antennas in the test setup.

Conventional antenna testing systems use two separate platforms to mount the reference antenna and the device under test. In such systems, before measurements can be made, the reference antenna and device under test must be aligned and calibrated (i.e., positions of the reference antenna and test device set and reference signals measured). If either component is moved, alignment and calibration must be repeated, thus limiting the portability of the system. Furthermore, antenna testing is often performed within small, parameter-controlled chambers, such as thermal chambers or anechoic chambers. Placing and aligning two separate platforms inside a small chamber is difficult, requiring repeated alignment and calibration steps which increases testing time and expense.

BRIEF SUMMARY

According to one aspect of the present disclosure, there is a system for testing parameters of an antenna under test. The system includes a test bed; a reference antenna, having known properties, mounted on the test bed; and a support, configured to receive and support the antenna under test, on the test bed.

Optionally, in any of the preceding aspects, the support is a surface of the test bed.

Optionally, in any of the preceding aspects, the support is a fixture affixed to the test bed.

Optionally, in any of the preceding aspects, the system further comprises a turntable rotatably mounted on the test bed, wherein the support is on the turntable.

Optionally, in any of the preceding aspects, the support is at a rotational axis of the turntable.

Optionally, in any of the preceding aspects, the support is a fixture at the center of the turntable.

Optionally, in any of the preceding aspects, the turntable is configured for automatic rotation.

Optionally, in any of the preceding aspects, the turntable is configured for manual rotation.

Optionally, in any of the preceding aspects, the reference antenna is mounted in a fixed position relative to the support.

Optionally, in any of the preceding aspects, the reference antenna is mounted in a variable position relative to the support.

Optionally, in any of the preceding aspects, the test bed comprises a plurality of discrete positions at which the reference antenna may be mounted.

According to one aspect of the present disclosure, there is a system for testing parameters of an antenna under test. The system comprises a test bed; a reference antenna, having known properties, mounted on the test bed; a turntable rotatably mounted on the test bed; and a support, configured to receive and support the antenna under test, on the turntable, wherein the turntable is configured to support the antenna under test for rotation relative to the reference antenna without changing a distance between the antenna under test and reference antenna.

Optionally, in any of the preceding aspects, the test bed and turntable are configured to be moved and used without having to re-calibrate the reference antenna to the antenna under test.

Optionally, in any of the preceding aspects, the support is a surface of the turntable.

Optionally, in any of the preceding aspects, the support is a fixture affixed to the turntable.

Optionally, in any of the preceding aspects, the reference antenna comprises a first reference antenna oriented along a first axis, the system further comprising a second reference antenna, having known properties, oriented along a second axis different than the first axis.

Optionally, in any of the preceding aspects, the first and second axes are perpendicular to each other.

According to one aspect of the present disclosure, there is a system for testing parameters of an antenna under test. The system comprises a test bed; a reference antenna, having known properties, mounted at a variable position on the test bed; a turntable rotatably mounted on the test bed; a support, configured to receive and support the antenna under test, on the turntable, wherein the turntable is configured to support the antenna under test for rotation relative to the reference antenna; and a control system configured to measure azimuth angle-dependent properties of the antenna under test at different azimuth angles of the antenna under test on the turntable.

Optionally, in any of the preceding aspects, the turntable is automatically rotated under control of the control system.

Optionally, in any of the preceding aspects, the reference antenna comprises a first reference antenna oriented along a first axis, the system further comprising a second reference antenna, having known properties, oriented along a second axis orthogonal to the first axis.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

BRIEF DESCRIPTION OF THE DRAWINGS

Aspects of the present disclosure are illustrated by way of example and are not limited by the accompanying figures for which like references indicate elements.

DETAILED DESCRIPTION

The present disclosure will now be described with reference to the figures (FIGS.), which in general relates to a test bed system for testing parameters of an antenna under test, also abbreviated herein as AUT.

It is understood that the present embodiments of the disclosure may be implemented in many different forms and that claim scopes should not be construed as being limited to the embodiments set forth herein. Rather, these embodiments are provided so that this disclosure will be thorough and complete and will fully convey the inventive embodiment concepts to those skilled in the art. Indeed, the disclosure is intended to cover alternatives, modifications and equivalents of these embodiments, which are included within the scope and spirit of the disclosure as defined by the appended claims. Furthermore, in the following detailed description of the present embodiments of the disclosure, numerous specific details are set forth in order to provide a thorough understanding. However, it will be clear to those of ordinary skill in the art that the present embodiments of the disclosure may be practiced without such specific details.

Figure 1:
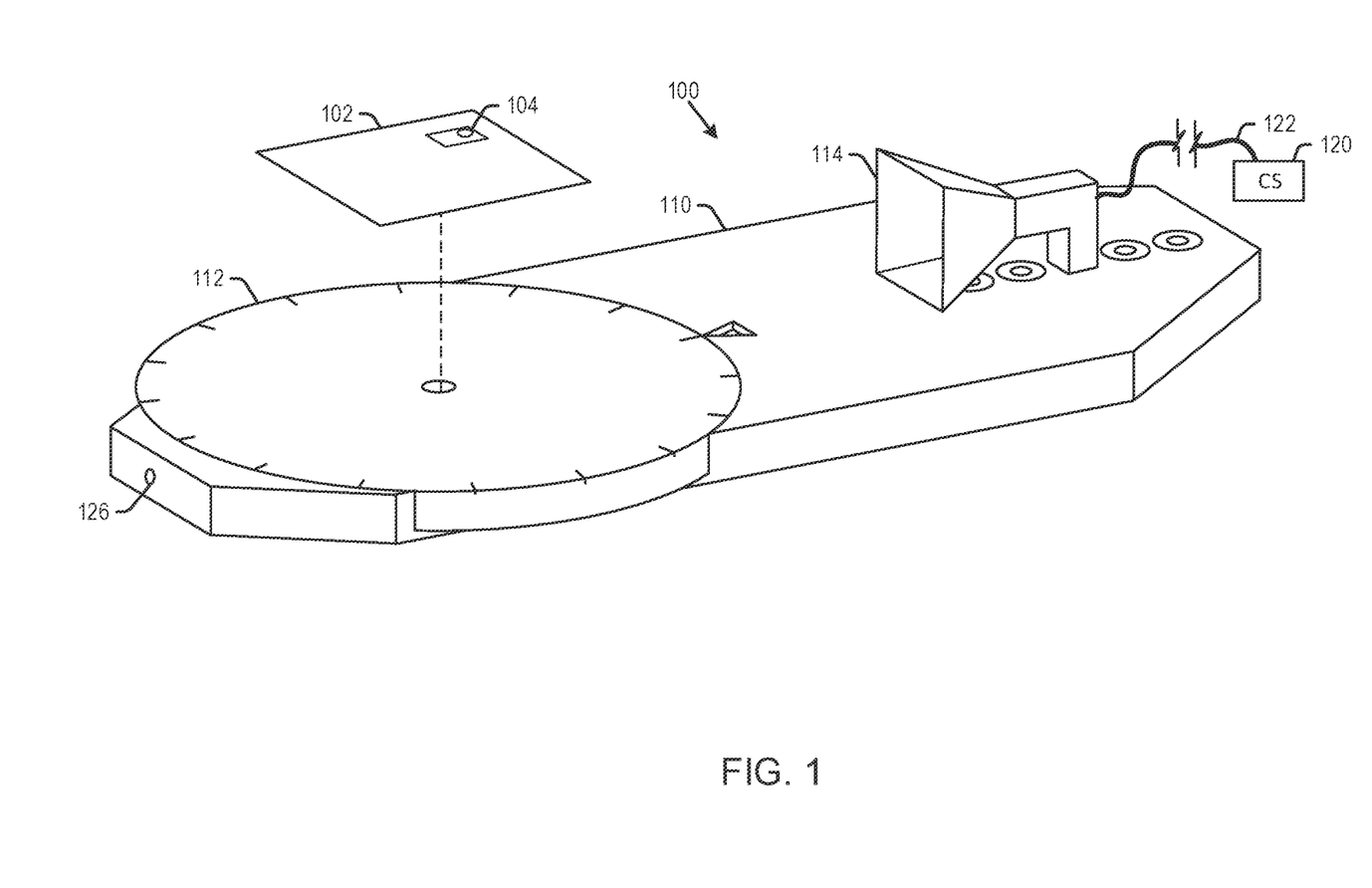
FIG. 1 illustrates a perspective view of an antenna test bed system according to embodiments of the present technology.
Figure 2:
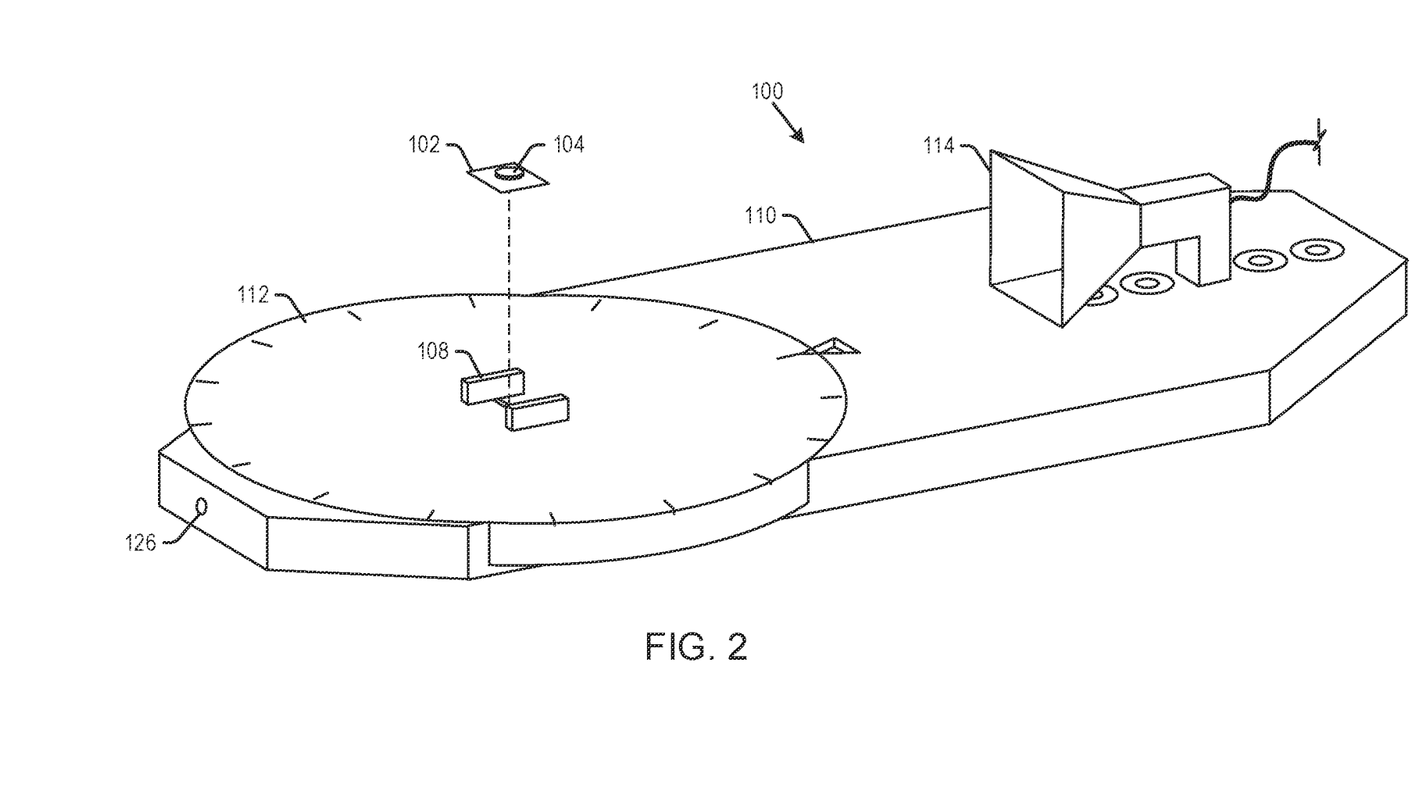
FIG. 2 illustrates a perspective view of an antenna test bed system according to alternative embodiments of the present technology.

FIGS. 1 and 2 illustrate examples of an antenna test bed system 100 for testing parameters of an antenna under test. These parameters may include, for example, power level, signal quality, beam width, beam steering range, and/or other properties. In embodiments, the antenna under test may be included within a device. FIG. 1 shows a device 102 in the form of a printed circuit board including an antenna 104. FIG. 2 shows a device 102 in the form of a semiconductor chip or package having an antenna 104 utilizing antenna-on-chip or antenna-in-package technology. The device 102 may be other electronic components using an antenna 104 in further embodiments. In the description that follows, reference to an antenna under test, or an AUT, refers to an antenna 104 which may be the antenna by itself on test bed 110, or within a device 102.

In embodiments, the device 102 and antenna under test 104 may rest directly on the turntable 112 during antenna testing. In an embodiment shown in FIG. 1, the device 102 and antenna 104 may be held in position on turntable 112 by the frictional engagement between a lower surface of the device 102 and the upper surface of turntable 112. In a further embodiment shown in FIG. 2, the turntable may include a fixture 108 for holding the device 102 and antenna 104 in position on the turntable 112. The fixture 108 may include a pair of movable clamps which may hold the device 102 in place. A wide variety of other mechanical fixtures may be used to hold the device 102 and antenna 104 on the turntable 112.

The antenna test bed system 100 may include a test bed 110 on which may be mounted a reference antenna 114 and a rotating turntable 112. As explained hereinafter, the test bed is provided with features allowing the distance between the reference antenna and turntable to be changed. However, once set, it is a feature of the test bed 110 to fix a position of the reference antenna 114 relative to the turntable 112. Accordingly, the test bed may be formed for example of nylon or other rigid plastics, metals, wood, ceramics or any of a variety of other rigid materials.

In embodiments, the antenna test bed system 100 is provided for far-field antenna measurements. For such testing, the distance between the reference antenna 114 and the AUT 104 exceeds some predefined minimum distance, depending on the frequency and on the size of the AUT 104. In one example, the antenna test bed system 100 may operate at frequencies between 30 GHz to 300 GHz, though the frequencies may be above or below that range in further embodiments. For example, a 60 GHz frequency generates a radio wave having a wavelength of 5 mm. Thus, with frequencies around this range, the test bed 110 can be small while still satisfying the far-field distance requirement.

In accordance with this feature, the test bed 110 may have a length between 8 and 18 inches, and more particularly 10 inches, though the length of the test bed may be longer or shorter than that in further embodiments. The width of the test bed 110 may be between 5 and 10 inches, and more particularly 7 inches, though the width of the test bed may be wider or narrower than that in further embodiments. The test bed 110 may have a thickness of between ¼ inch and 1 inch, though the thickness may be lesser or greater than that in further embodiments.

The shape of the test bed 110 is shown as being generally rectangular, with mitered or chamfered corners, and a depression for receiving turntable 112 as explained below. However, it is understood that the test bed may be formed without mitered or chamfered corners, or in shapes other than rectangular, with the limitation that the test bed be provided to mount the reference antenna 114 and turntable 112, and to fix the positions of the reference antenna 114 and turntable 112 relative to each other.

It is a feature of the present technology that the turntable 112 may be provided to rotate the AUT 104 so that a performance of the AUT 104 can be tested and measured through 360° of azimuth rotation. As seen for example in FIGS. 3 and 4, the turntable 112 may fit within a recessed section 116 formed in the test bed 110. Where test bed 110 is formed of plastic or metal, the recessed section 116 may be cast into the test bed 110 during formation of the test bed. The recessed section 116 may alternatively be machined into the test bed 110. The turntable 112 may in turn be rotationally mounted within the recessed section 116, as for example by a bearing 118, though other mechanical connectors allowing rotation of the turntable 112 within test bed 110 are possible. The turntable 112 may be formed of the same material as test bed 110, and may have a diameter which is generally the same as the width of the test bed 110, though the diameter of the turntable 112 may be smaller or larger than the width of the test bed 110 in further embodiments.

Figure 3:
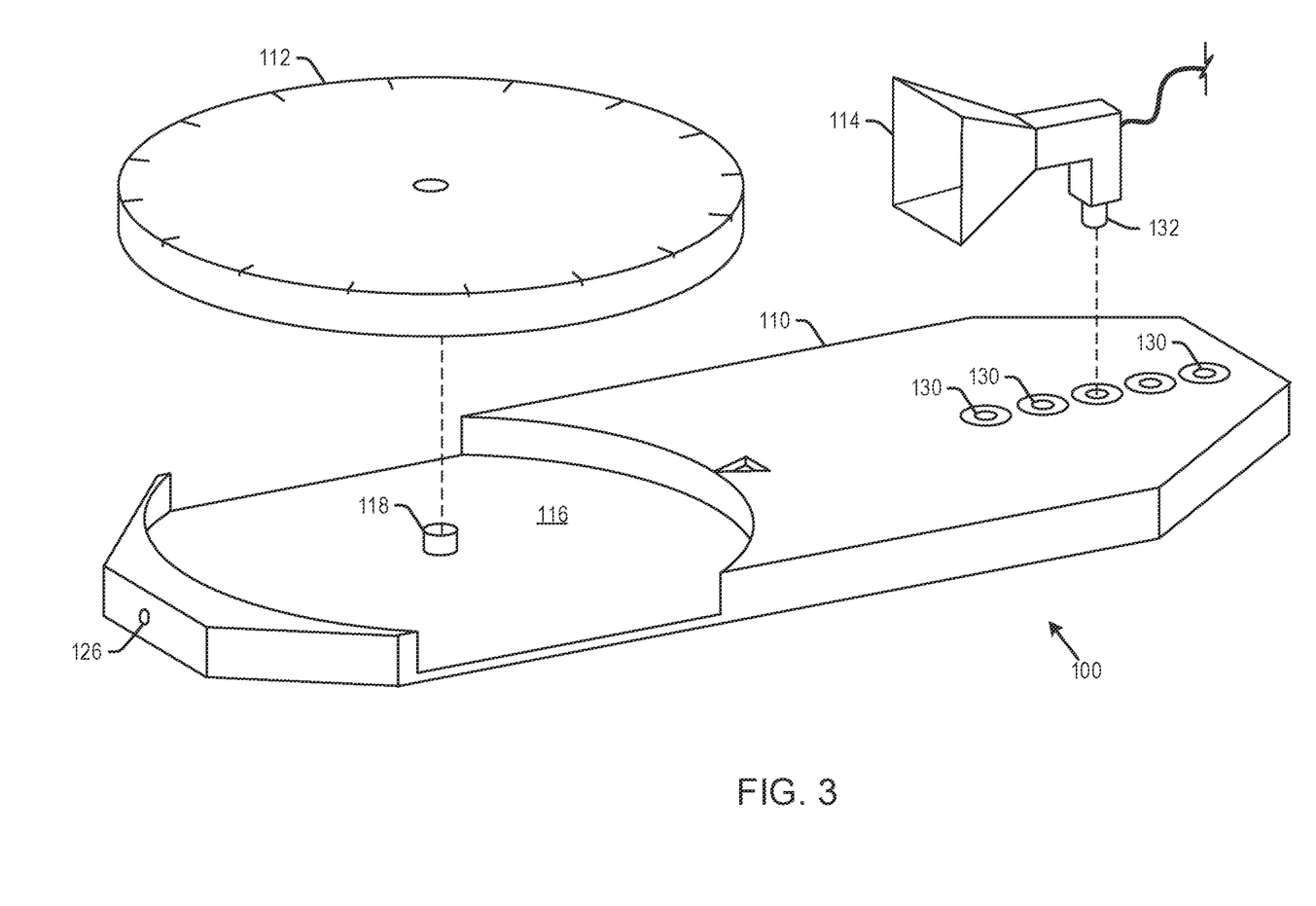
FIG. 3 illustrates an exploded perspective view of an embodiment of the present technology.
Figure 4:
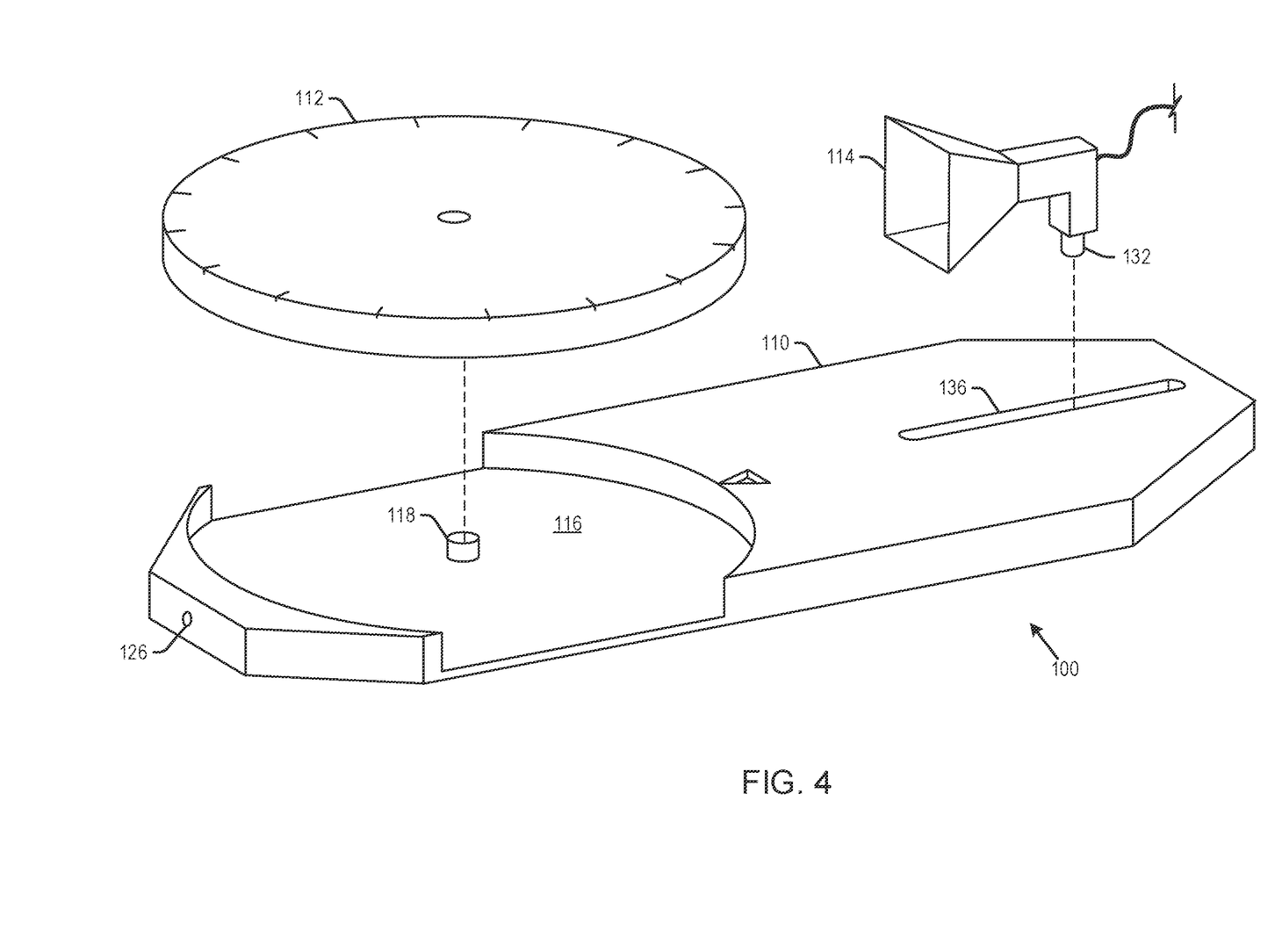
FIG. 4 illustrates an exploded perspective view of an alternative embodiment of the present technology.

The turntable 112 may be mounted within the recessed section 116 such that an upper surface of the turntable 112 lies just above an upper surface of the test bed 110. Thus, objects larger than a diameter of the turntable may be rotated on turntable 112 without interference from the upper surface of the test bed 110. However, the turntable 112 may be mounted in recessed section 116 so that the upper surface of the turntable 112 is flush with or below the upper surface of the test bed 110.

The turntable 112 may be manually rotated. Alternatively, a stepper or other type of motor (not shown) may be provided for automatic rotation of the turntable 112. Once at a desired azimuth angle with respect to the reference antenna 114, the position of the turntable 112 may be fixed. For example, a set screw 126 may be provided which can be loosened to allow rotation of turntable 112, and tightened to prevent rotation. Other mechanical, electrical or magnetic methods may be used to fix the position of the turntable 112 at a desired azimuth angle.

Reference antenna 114 may be a known antenna, such as for example a far-field horn antenna with a frequency range of 30 GHz to 300 GHz, and a gain of 15 dBi. Such a reference antenna is available for example from Sage Millimeter, Inc. of Torrance, Calif. However, it is understood that reference antenna 114 may have a variety of properties and parameters other than those set forth above. In embodiments, the reference antenna may be positioned so as to face a center point of the turntable 112. The reference antenna may be coupled to a control system 120 (shown schematically in FIG. 1) via a cable 122, though the connection may be wireless in further embodiments.

It is a feature of the present technology that both the turntable 112 receiving an AUT 104 and the reference antenna 114 are integrated into a single test bed 110 to provide a known and fixed distance between the AUT 104 and reference antenna 114. However, it is also a feature of the present technology that the position of the reference antenna relative to the AUT 104 may be changed by changing a position at which the reference antenna 114 is mounted on the test bed 110. The position of the reference antenna can be changed to ensure both that the far-field condition is met for a variety of antenna sizes and frequencies, and also to vary the power received by the reference antenna 114.

FIG. 3 shows a number of mounting holes 130 on a surface of test bed 110 for receiving a mounting peg 132 of the reference antenna 114. The mounting peg 132 may fit snuggly within a selected mounting hole 130 to affix the reference antenna 114 onto the test bed 110 by a frictional fit. Alternatively, the mounting peg 132 may be removably locked within a selected mounting hole. Locking mechanisms for this purpose are known, such as for example a locking ball within the shaft of the mounting peg 132 that is configured to controllably move between a retracted position within the mounting peg and an extended position where it extends outside of the footprint of the mounting peg 132, and into a detent formed in a sidewall of a mounting hole 130 to lock the peg 132 within the mounting hole 130.

FIG. 3 illustrates an example of discrete mounting positions of the reference antenna 114 at the mounting holes 130. However, the reference antenna 114 may alternatively be mounted at continuous positions along the test bed 110. FIG. 4 shows such an example, including a slot 136 for receiving the mounting peg 132 of the reference antenna. The mounting peg 132 may be mounted to the test bed 110 at any position along the slot 136. As in the embodiment of FIG. 3, the mounting peg in FIG. 4 may be held in the slot 136 by a frictional fit, or by a locking mechanism.

Figure 5:
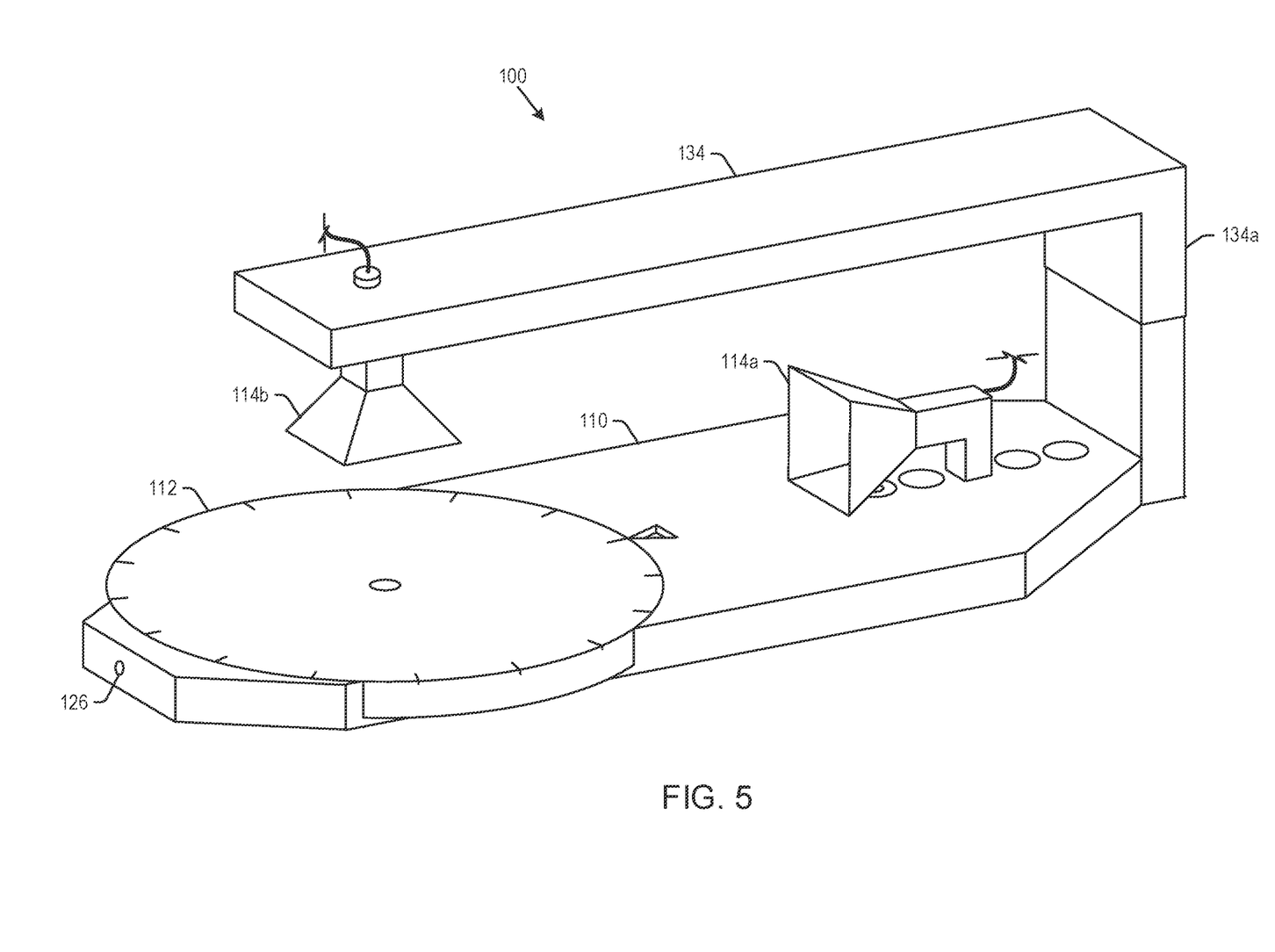
FIG. 5 illustrates a perspective view of an antenna test bed system according to a further alternative embodiment of the present technology.

In embodiments described above, there is a single reference antenna 114 for receiving RF signals from the AUT 104. However, there may be more than one reference antenna in further embodiments. FIG. 5 shows an embodiment including first and second reference antennas 114a and 114b. The second reference antenna 114b may, for example, be supported over the turntable 112 by an L-bracket 134 affixed to the test bed 110. Thus, both reference antennas 114a, 114b are in fixed positions relative to the AUT 104 on the turntable 112. The second reference antenna 114b may increase the area covered by a single reference antenna by itself. It is conceivable that a portion 134a of the L-bracket 134 may include one or more telescopic sections to allow the height of the second reference antenna 114b over the turntable 112 to be continuously variable. Portion 134a of the L-bracket may be a single integral piece in further embodiments.

Figure 6:
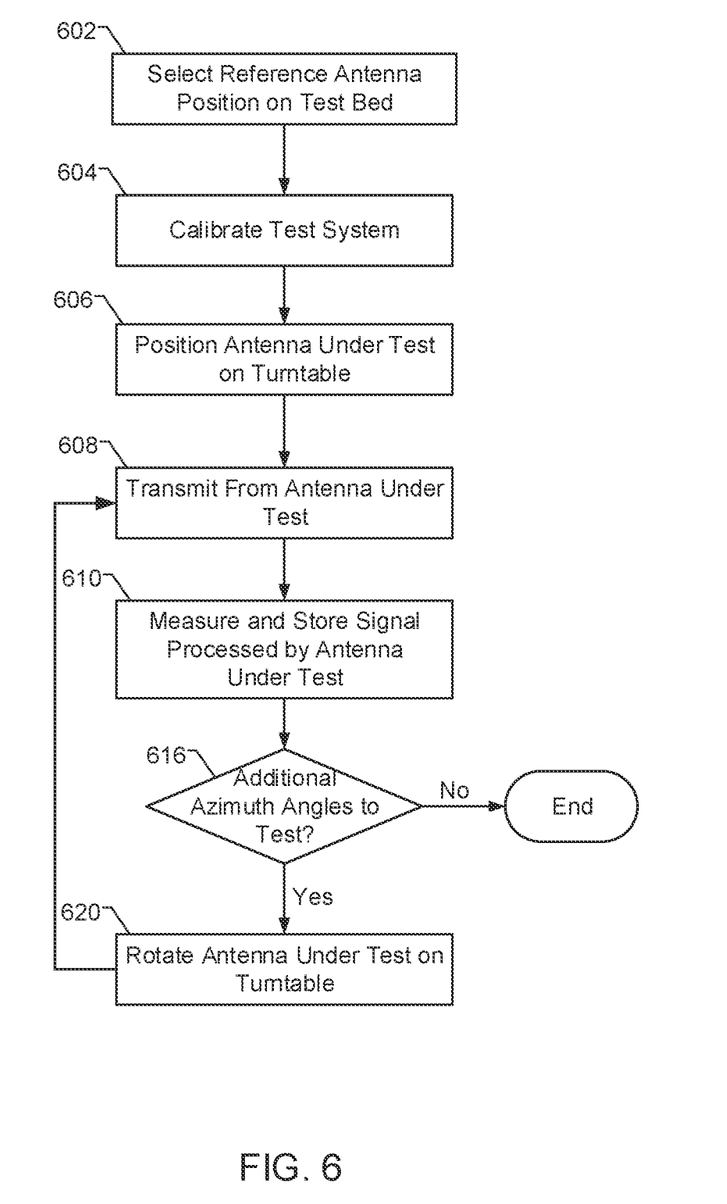
FIG. 6 is a flowchart illustrating operation of an embodiment of the present technology.

FIG. 6 is a flowchart illustrating operation of an embodiment of the present technology. In step 602, the reference antenna(s) 114 may be positioned on the test bed 110. As noted above, the position of the reference antenna(s) may be selected based on ensuring that the far-field condition is met for the size and frequency range of the AUT 104 and reference antenna(s) 114, as well to provide a desired power level received by the reference antenna(s).

In step 604, the antenna test bed system 100 may be calibrated. The calibration process may entail placing a device having a calibration antenna on the turntable 112, transmitting from the calibration antenna to the reference antenna(s), and measuring the received signal at the control system 120. The calibration antenna on the turntable 112 has known properties, for example, the same properties as the reference antenna(s) 114. Thus, it would be expected that the properties of the signal transmitted from calibration antenna and reference antenna are known.

However, environmental and system conditions may effect signal transmission between the calibration and reference antennas. Environmental conditions may include metal in walls or other features of the environment in which the test system 100 is used. System conditions may include the type of cables 122 used to connect the reference antenna(s) 114 to the control system 120.

In step 604, an RF signal may be transmitted from the calibration antenna to the reference antenna(s) 114. The properties of the received signal (e.g., power level, signal quality, etc.) may then be measured and stored as a baseline. When signals are transmitted from an antenna under test as explained below, the baseline measurements can be used to eliminate environmental and system factors from the measured signal. The turntable may also be rotated during the calibration process to take measurements from the calibration antenna at different azimuth angles.

In step 606, a device 102 including the antenna under test 104 may be positioned on the turntable 112. The device 102 may transmit using the antenna under test to the reference antenna(s) 114 in step 608, and the received signal may be measured and stored by the control system in step 610. Thereafter, if there are additional azimuth angles to test in step 616, the turntable may be rotated in step 620, and the flow may return to step 608 where the RF signal at the new azimuth angle is transmitted, measured and stored. If there are no additional azimuth angles to test in step 616, the testing process may end.

Using the above process, measurements may be taken of an AUT 104 over entire 360° of azimuth to determine how the RF signal may vary at different azimuth angles. Additionally, the antenna test bed system 100 uses a single platform with integrated reference antenna and turntable to fix the relative alignment and distance between the reference antenna and turntable. This ensures repeatable measurements. Additionally, the system 100 can be moved, and/or a new device and AUT 104 can be swapped out, with no new calibration process required. This reduces test time and costs.

Moreover, the single platform with integrated reference antenna and turntable have a compact size. This provides advantages in that the entire test bed system may be moved to test antennas in different environments. For example, it is known to perform antenna testing in thermal chambers which vary temperature. It is also known to perform antenna testing in shielded anechoic chambers to prevent signal reflection. The antenna test bed system 100 of the present technology may be moved to and used within these and other chambers.

Additionally, the position of the reference antenna may be varied and then fixed, to ensure far-field conditions are met for a different testing antenna sizes and gains, and to vary power levels from the antenna under test.

It is understood that the present subject matter may be embodied in many different forms and should not be construed as being limited to the embodiments set forth herein. Rather, these embodiments are provided so that this subject matter will be thorough and complete and will fully convey the disclosure to those skilled in the art. Indeed, the subject matter is intended to cover alternatives, modifications and equivalents of these embodiments, which are included within the scope and spirit of the subject matter as defined by the appended claims. Furthermore, in the following detailed description of the present subject matter, numerous specific details are set forth in order to provide a thorough understanding of the present subject matter. However, it will be clear to those of ordinary skill in the art that the present subject matter may be practiced without such specific details.

The terminology used herein is for the purpose of describing particular aspects only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

For purposes of this document, each process associated with the disclosed technology may be performed continuously and by one or more computing devices. Each step in a process may be performed by the same or different computing devices as those used in other steps, and each step need not necessarily be performed by a single computing device.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A system for testing parameters of an antenna under test, comprising:
   a test bed;
   a reference antenna mounted on the test bed; and
   a support disposed on the test bed and configured for positioning an antenna under test a distance from the reference antenna based on an operating frequency and a size of the antenna under test.

2. The system of claim 1, wherein the support is a surface of the test bed.

3. The system of claim 1, wherein the support is a fixture affixed to the test bed.

4. The system of claim 1, further comprising a turntable rotatably mounted on the test bed, wherein the support is on the turntable.

5. The system of claim 4, wherein the support is at a rotational axis of the turntable.

6. The system of claim 4, wherein the support is a fixture at a center of the turntable.

7. The system of claim 4, wherein the turntable is configured for automatic rotation.

8. The system of claim 4, wherein the turntable is configured for manual rotation.

9. The system of claim 1, wherein the reference antenna is mounted in a fixed position relative to the support.

10. The system of claim 1, wherein the reference antenna is mounted in a variable position relative to the support.

11. The system of claim 1, wherein the test bed comprises a plurality of discrete positions at which the reference antenna may be mounted.

12. A system for testing parameters of an antenna under test, comprising:
    a test bed;
    a reference antenna mounted on the test bed;
    a turntable rotatably mounted on the test bed; and
    a support configured to receive and support the antenna under test, wherein the support is on the turntable, and wherein the support is configured to position the antenna under test a distance from the reference antenna based on an operating frequency and a size of the antenna under test.

13. The system of claim 12, wherein the test bed and the turntable are configured to be moved and used without having to re-calibrate the reference antenna to the antenna under test.

14. The system of claim 12, wherein the support is a surface of the turntable.

15. The system of claim 12, wherein the support is a fixture affixed to the turntable.

16. The system of claim 12, wherein the reference antenna comprises a first reference antenna oriented along a first axis, and wherein the system further comprises a second reference antenna that is oriented along a second axis different than the first axis.

17. The system of claim 16, wherein the first axis and the second axis are perpendicular to each other.

18. A system for testing parameters of an antenna under test, comprising:
- a test bed;
- a reference antenna mounted at a variable position on the test bed;
- a turntable rotatably mounted on the test bed;
- a support, configured to receive and support the antenna under test, wherein the support is on the turntable, and wherein the support is configured to position the antenna under test a distance from the reference antenna based on an operating frequency and a size of the antenna under test; and a control system configured to:
  - obtain different azimuth angles of the antenna under test by rotating the turntable;
  - receive signals transmitted from the antenna under test, wherein the signals are generated based on the different azimuth angles of the antenna under test; and
  - measure, based on the signals transmitted from the antenna under test, azimuth angle-dependent properties of the antenna under test at the different azimuth angles of the antenna under test on the turntable.

19. The system of claim 18, wherein the turntable is automatically rotated under control of the control system.

20. The system of claim 18, wherein the reference antenna comprises a first reference antenna oriented along a first axis, and wherein the system further comprises a second reference antenna oriented along a second axis orthogonal to the first axis.

21. The system of claim 1, wherein the reference antenna has at least one known property, the at least one known property comprising one or more of the following properties: a power level, a signal quality, a beam width, or a beam steering range.

\* \* \* \* \*